United States Patent [19]
Fett et al.

[11] 3,959,666
[45] May 25, 1976

[54] LOGIC LEVEL TRANSLATOR

[75] Inventors: Darrell L. Fett, Scottsdale; David A. Bird, Phoenix, both of Ariz.

[73] Assignee: Honeywell Information Systems, Inc., Waltham, Mass.

[22] Filed: July 1, 1974

[21] Appl. No.: 484,513

[52] U.S. Cl. .............................. 307/208; 307/214; 307/215; 307/218; 307/235 T; 307/DIG. 1
[51] Int. Cl.² ................. H03K 19/08; H03K 5/02; H03K 5/08; H03K 5/156
[58] Field of Search ........... 307/203, 208, 215, 218, 307/270, 214, DIG. 1, 235 T

[56] References Cited
UNITED STATES PATENTS

| | | |
|---|---|---|
| 3,329,835 | 7/1967 | D'Agostino .................... 307/203 X |
| 3,660,676 | 5/1972 | Fleischhammer .......... 307/DIG. 1 X |
| 3,679,917 | 7/1972 | Bryant et al. .................... 307/215 X |
| 3,723,761 | 3/1973 | Masaki .............................. 307/208 |
| 3,755,693 | 8/1973 | Lee ................................. 307/270 X |

OTHER PUBLICATIONS

Taylor, "Logic Signal Level Shift Circuit;" IBM Tech. Discl. Bull.; Vol. 12, No. 2; pp. 296; 7/1969.

Primary Examiner—John S. Heyman
Assistant Examiner—Larry N. Anagnos
Attorney, Agent, or Firm—R. T. Reiling; D. A. Frank

[57] ABSTRACT

A logic level translator uses a current switch, a current source and a plurality of cathode followers to convert T²L and DTL level binary signals into CML and ECL level binary signals. The translator provides isolation between the T²L ground and the CML ground so that noise in the CML signals is reduced.

13 Claims, 3 Drawing Figures

LOGIC LEVEL TRANSLATOR

BACKGROUND OF THE INVENTION

The present invention relates to logic level translators and more particularly to a translator which uses a current switch, a current source and a plurality of cathode followers to convert $T^2L$ and DTL level binary signals into CML and ECL level binary signals. In modern data processing systems transistor transistor logic ($T^2L$), diode transistor logic (DTL), current mode logic (CML) and emitter coupled logic (ECL) are used to manipulate, store and process data which is represented in binary form. In many of the modern data processing systems several of the different types of logic may be used in different portions of the data processing system. In order to transfer data from one portion of the processing system to another portion of the system it is often necessary to translate from one type of logic signal into one of the other types of logic signals. Prior art signal translators use diodes and other semiconductor devices to obtain a fixed voltage drop to translate from one type of binary signal level to another type of binary signal level. These prior art translators use a common ground which is shared by both the input and the output signals. For example, a $T^2L$ input signal and a CML output signal would use the same bus line as a common ground. The $T^2L$ currents flowing in the common ground bus produce noise signals in the CML output portion of the translator. Also, variations in the power supply voltage used in the $T^2L$ is coupled to the CML output portion of the circuit. The prior art translators produce unequal delays for the positive and the negative going voltages of the binary signals when these signals are translated from the $T^2L$ logic to the CML logic. Thus, it is important that the noise developed in the prior art translators be eliminated to prevent error signals from being generated in the output of the data processing system.

The present invention uses a resistive voltage divider and a plurality of emitter followers to provide isolation between the $T^2L$ input signals and the CML output signals. The translator also uses separate $T^2L$ and CML ground busses so that the noise signals from the $T^2L$ portion of the translator are not coupled to the CML portion of the translator.

It is, therefore, an object of this invention to provide new and improved apparatus to translate $T^2L$ level binary signals into CML level binary signals.

Another object of this invention is to provide apparatus which translates $T^2L$ level binary signals into ECL level binary signals.

A further object of this invention is to provide apparatus which translates DTL level binary signals into CML level binary signals.

Still another object of this invention is to provide apparatus which translates DTL level binary signals into ECL level binary signals.

Another object of this invention is to provide a logic level translator which reduces the noise from $T^2L$ signals and converts the $T^2L$ level binary signals into CML binary signals.

A further object of this invention is to provide a logic level translator which provides a relatively short time delay in the converted signals.

Still another object of this invention is to provide a logic level translator which provides isolation between the $T^2L$ ground bus and the CML ground bus.

Another object of this invention is to reduce the current transfer between the $T^2L$ power supply and the CML power supply.

A further object of this invention is to reduce the noise coupled from the $T^2L$ power supply to the CML power supply.

SUMMARY OF THE INVENTION

The foregoing objects are achieved in the present invention by providing a logic level translator which uses a resistive voltage divider, a current switch, a current source and a plurality of cathode followers to convert $T^2L$ and DTL level binary signals into CML and ECL level binary signals. The translator provides isolation between the $T^2L$ ground bus and the CML ground bus so that noise signals in the CML output signals is reduced.

Other objects and advantages of this invention will become apparent from the following description when taken in connection with the accompanying drawings.

DESCRIPTION OF THE PREFERRED EMBODIMENT

Figure 1:
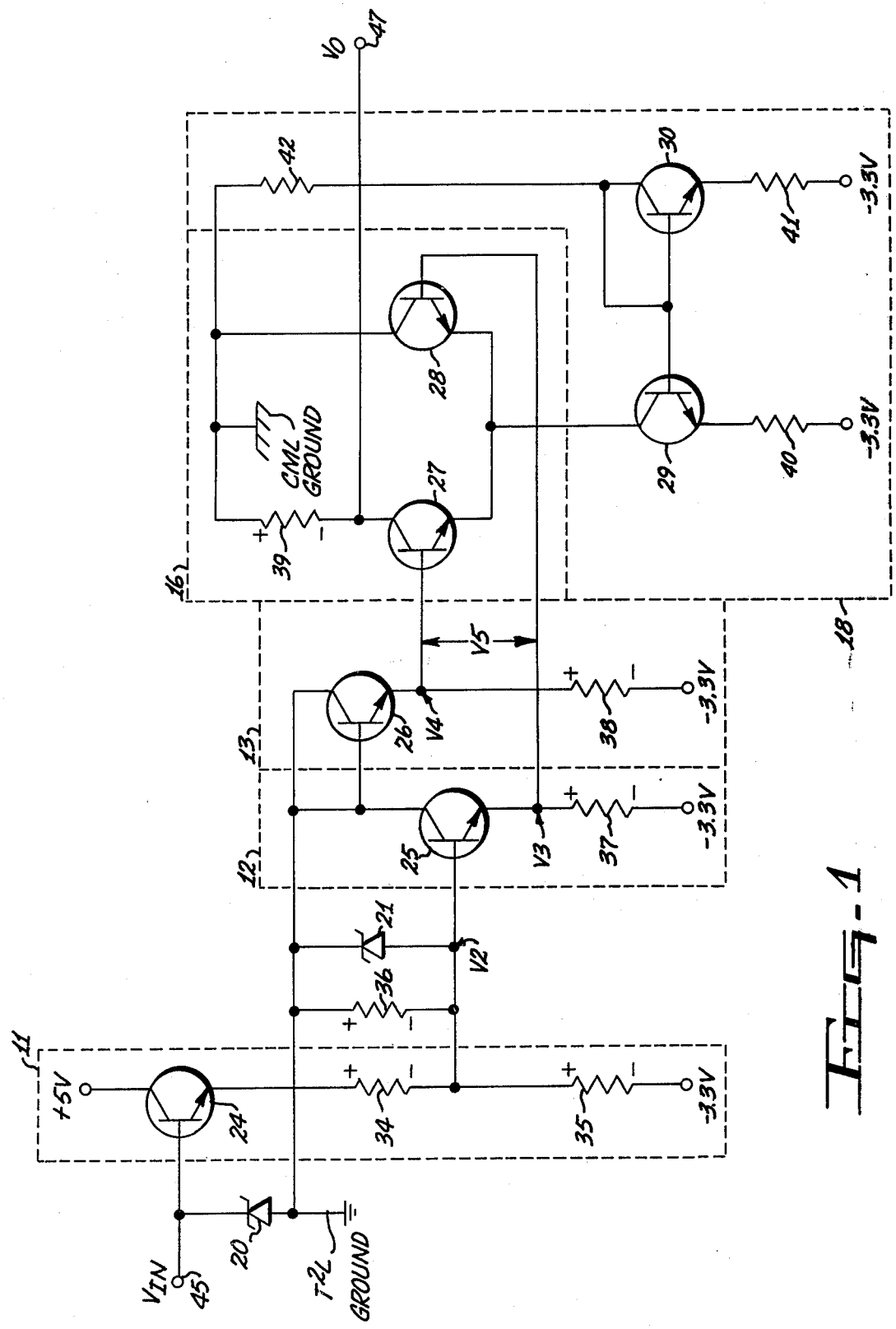
FIG. 1 shows a circuit diagram of one embodiment of the present invention which converts $T^2L$ level signals to CML level signals.

Referring more particularly to the drawings by the characters of reference, FIG. 1 discloses a logic level translator having a plurality of cathode followers 11-13, a current switch 16, a current source 18 and a divider network which includes resistors 34-36. A $T^2L$ level signal or a DTL level signal applied to the signal input terminal 45 is translated into a CML level signal at the output terminal 47. Isolation is provided between the $T^2L$ ground near the signal input terminal and the CML ground in the current switch 16 by the cathode followers and by the voltage divider network comprising resistors 34-36. This isolation between the $T^2L$ ground and the CML ground and the use of differential inputs to the transistors 27 and 28 in the current switch greatly reduces the noise which may be transferred between the $T^2L$ ground bus and the CML ground bus. This causes the circuit to provide a relatively noise free output signal at the output terminal 47.

The constant-current source 18 includes a pair of transistors 29 and 30 each having a base, a collector and an emitter. The emitters of transistors 29 and 30 are coupled to the −3.3 volt potential by resistors 40 and 41 respectively. The collector of transistor 30 and the bases of transistors 29 and 30 are each coupled through resistor 42 to the CML ground.

Transistors 29 and 30 are selected so that their operating characteristics are substantially identical and resistors 40 and 41 have values which are substantially identical. This selection of transistors and resistors causes current through transistor 29 to be substantially constant even when voltage across the constant-source 18 changes. This selection of transistors also causes current through transistor 29 to be constant when the current gain of the transistor changes due to temperature changes.

The base and the collector of transistor 30 are connected together so that the transistor operates as a diode to establish a reference voltage at the base of transistor 29. The relative values of resistors 41 and 42 determine the value of the reference voltage at the base of transistor 29. The value of the voltage at the base of transistor 29 and the value of resistor 40 determine the value of current between base and emitter of transistor 29. The value of the current between base and emitter of transistor 29 and the current gain of transistor 29 determine the value of the current flowing between collector and emitter of transistor 29. When the base to emitter current is constant and the current gain is constant, the collector to emitter current of transistor 29 is constant.

Figure 2:
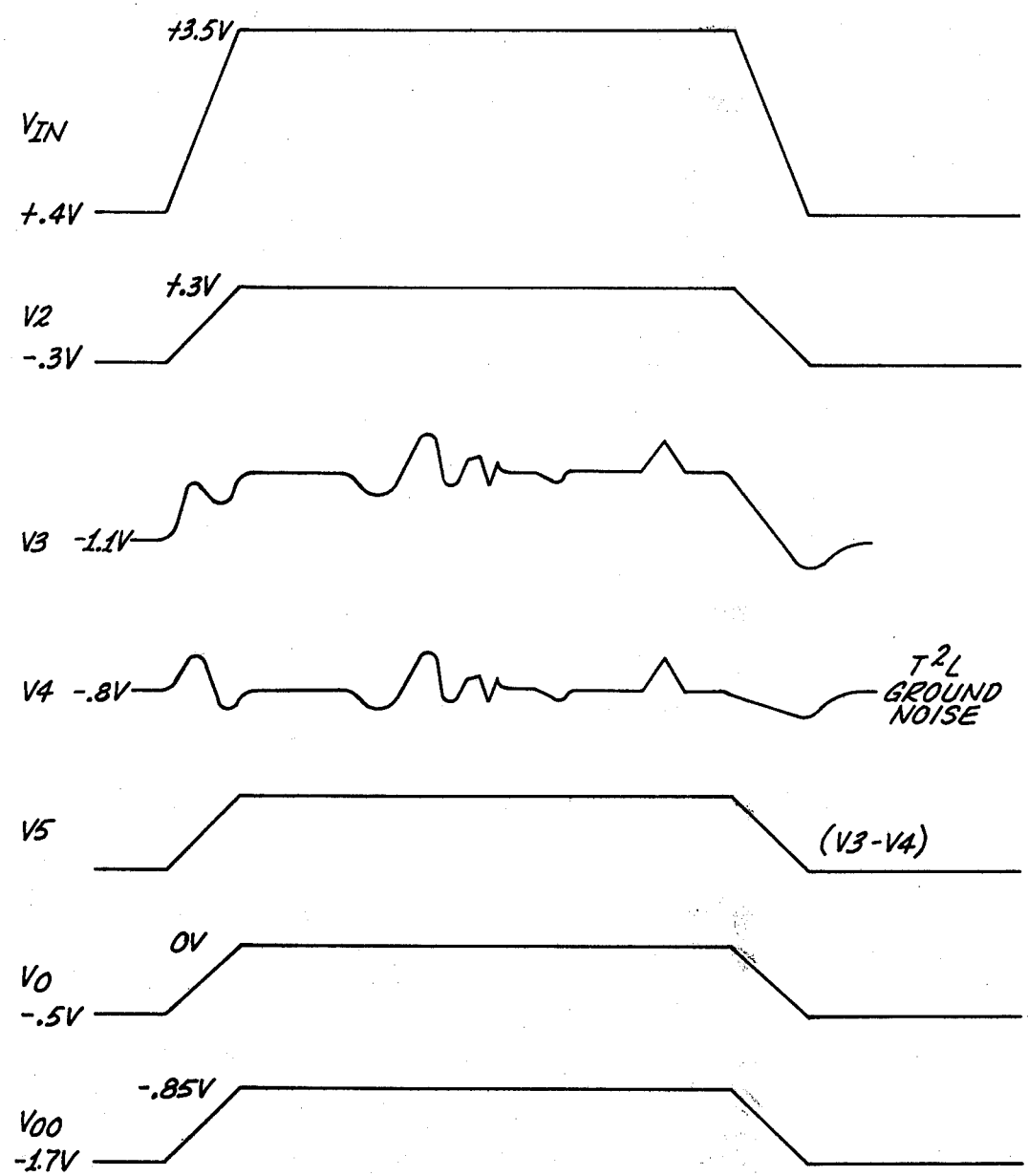
FIG. 2 shows waveforms which are useful in explaining the operation of the invention shown in FIG. 1.

Details of the operation of the circuit shown in FIG. 1 will now be described in connection with the waveforms of FIG. 2. When a $T^2L$ signal of a +0.4V representing a binary zero is applied to the input terminal 45, transistor 24 is rendered nonconductive. When transistor 24 is rendered nonconductive a current flows from the $T^2L$ ground through resistors 36 and 35 to the −3.3V terminal, thereby providing a voltage drop of the polarity shown across resistor 36. The voltage drop across resistor 36 provides a voltage of approximately −0.3V at the base of transistor 25.

Transistor 25 acts as a buffer and voltage translator with a voltage drop of approximately 0.8 volts between the base and emitter so that the emitter voltage V3 is now approximately −1.1V. In a similar manner, transistor 26 provides an output voltage V4 which is 0.8 volts lower than the $T^2L$ ground volts on the base of transistor 26. The −0.8volts from the emitter of transistor 26 is coupled to the base of transistor 27 and the −1.1 volts from the emitter of transistor 25 is coupled to the base of transistor 28. Since the voltage at the base of transistor 27 is less negative than the voltage at the base of transistor 28 transistor 27 is rendered conductive and transistor 28 is rendered nonconductive. When transistor 27 is conductive a current flows from the CML ground through resistor 39, from collector to emitter of transistor 27, through transistor 29 and resistor 40 to the −3.3V potential. The voltage drop across resistor 39 produces a −0.5 volt potential at the output terminal 47 (shown as V0 in FIGS. 1 and 3).

The noise voltages between the $T^2L$ ground and the CML ground are added to both the V3 signal voltage and the V4 signal voltage. The current switch 16 responds to the difference between the value of voltage V3 and voltage V4 (shown as V5 in FIG. 2), so that the noise voltages are cancelled.

When a +3.5 volt signal representing a binary one is applied to the signal input terminal 45 transistor 24 is rendered conductive. When transistor 24 is rendered conductive a current flows from the +5V potential through collector to emitter of transistor 24, through resistors 34 and 35 to the −3.3V potential and through resistors 34 and 36 to $T^2L$ ground. The current through the transistor 24 greatly increases the current through resistor 35 so that the voltage drop across resistor 35 increases. The increased voltage drop across resistor 35 causes the potential at the base of transistor 25 to be more positive than $T^2L$ ground. The voltage at the base of transistor 25 is now more positive than the voltage at the base of transistor 26 so that the voltage at the emitter of transistor 25 is more positive than the voltage at the emitter of transistor 26. This causes transistor 28 to be rendered conductive and transistor 27 to be rendered nonconductive. When transistor 28 is conductive the current flows from the CML ground through collector to emitter of transistor 28, through transistors 29 and resistor 40 to the −3.3V potential. When transistor 28 is rendered conductive transistor 27 is nonconductive so that there is no longer a voltage drop across resistor 39 and the voltage at output terminal 27 is substantially at the CML ground potential.

It should be noted that the potential on the bases of transistor 27 and 28 may vary due to the variation of the potential on the $T^2L$ ground. This $T^2L$ ground signal is coupled through emitter follower 12 to the base of transistor 28 and the same $T^2L$ ground signal is coupled through emitter follower 13 to the base of transistor 27. However, since the $T^2L$ ground voltage on the base of transistor 27 varies at the same rate as the $T^2L$ ground voltage on the base of transistor 28 these variations are cancelled by the current switch 16 and the signal at the output terminal 47 is relatively free of any noise which may be developed in the $T^2L$ ground bus. Diodes 20 and 21 limit the signal voltage at the bases of transistors 24 and 25 respectively.

Figure 3:
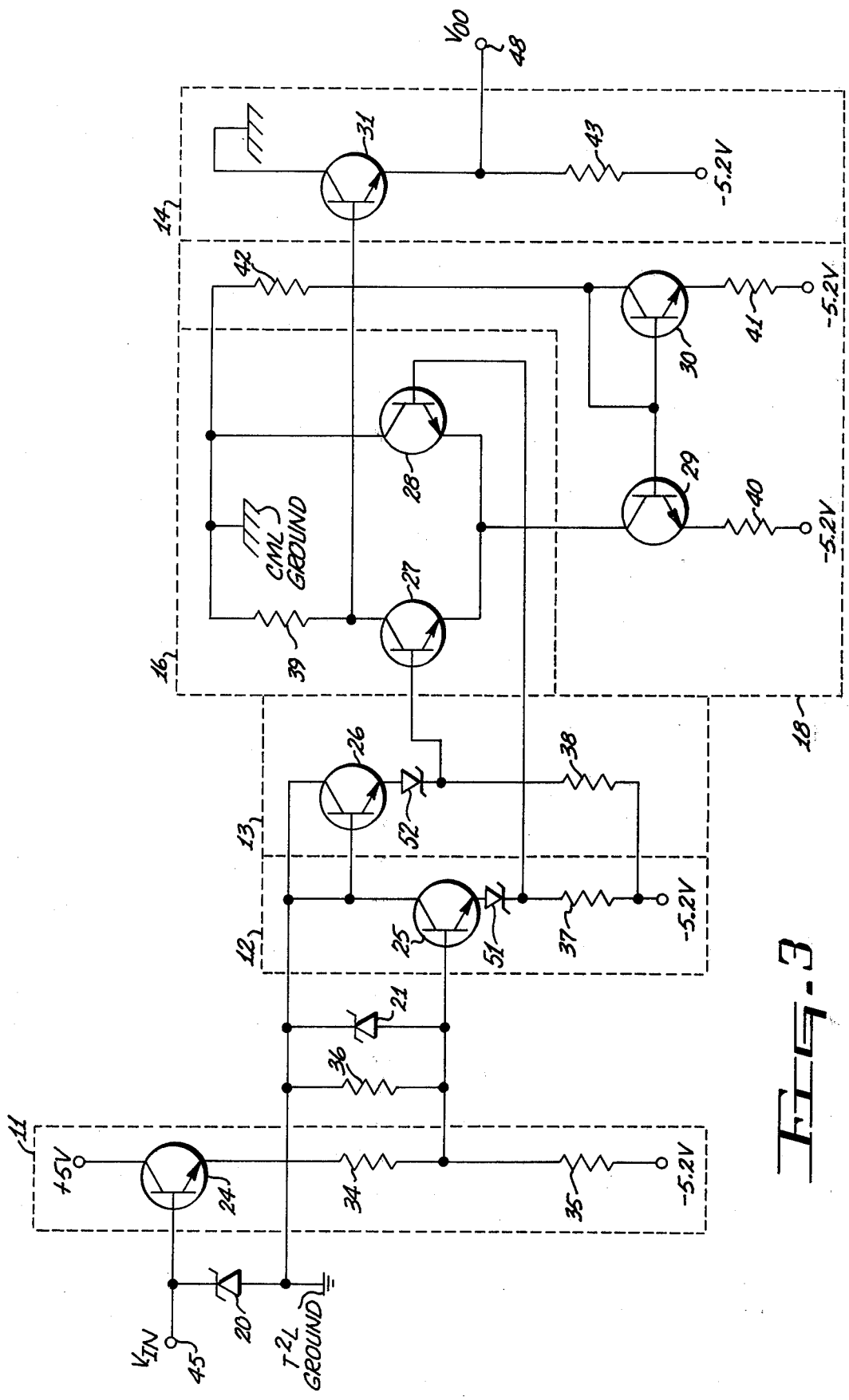
FIG. 3 shows an embodiment of the present invention which converts $T^2L$ level binary signals to ECL level binary signals.

When it is desired to translate the $T^2L$ level signal or the DTL level signal to an ECL level signal the emitter follower 14 of FIG. 3 is added to the embodiment of the circuit shown in FIG. 1. The circuit of FIG. 3 also includes the addition of diodes 51 and 52 to provide an increase in the voltage drop in the emitter followers 12 and 13 so that the voltage on the base of transistors 27 and 28 is more negative than in the embodiment shown in FIG. 1. An additional drop across transistor 31 in the ECL output emitter follower causes the voltage at the output terminal 48 (shown as V00 in FIGS. 2 and 3) to be approximately −1.7 volts for a binary zero and approximately a −0.85 volts for a binary one.

While the principles of the invention have now been made clear in an illustrative embodiment, there will be many obvious modifications of the structure, proportions, materials and components without departing from those principles. The appended claims are intended to cover any such modifications.

What is claimed is:

1. A logic level translator for translating first signals having a first logic level swing with respect to ground of a first unit to second signals having a second logic level swing with respect to ground of a second unit said translator comprising:
    reference potential means for providing reference potential signals;
    voltage dividing means coupled to said first unit ground and to said reference voltage means and responsive to said first signals;
    a first emitter follower with its input terminal coupled to said first unit ground;
    a second emitter follower with its input terminal responsive to signals from said voltage dividing means; and
    current switching means having first and second power terminals coupled to said reference potential means and to said second unit ground respectively, said current switching means responsive to the difference between signals generated by said first and said second emitter followers, said current switching means generating output signals.

2. A logic level translator as defined in claim 1 further including current source means which couples said first power terminal to said reference potential means.

3. A logic level translator as defined in claim 1 further including a third emitter follower which couples said first signals to said voltage dividing means.

4. A logic level translator as defined in claim 1 further including a third emitter follower coupled between said second unit ground and said reference potential means and responsive to said output signals, said fourth emitter follower generating signals which have said second logic level swing.

5. A logic level translator as defined in claim 1 wherein said current switching means comprises a transistor pair with their collectors connected to said second power terminal and their emitters connected to said first power terminal, the base of one transistor of said transistor pair responsive to signals generated by said first emitter follower, the base of the other transistor of said transistor pair responsive to signals generated by said second emitter follower.

6. A logic level translator for translating TTL logic level signals with respect to ground of a first unit to CML logic level signals with respect to ground of a second unit, said translator comprising:
reference potential means for providing reference potential signals;
voltage dividing means coupled to said first unit ground and said reference voltage means and responsive to said TTL signals;
a first emitter follower with its input terminal coupled to said first unit ground;
a second emitter follower with its input terminal responsive to signals from said voltage dividing means; and
current switching means having first and second power terminals coupled to said reference potential means and to said second unit ground respectively, said current switching means responsive to the difference between signals generated by said first and said second emitter followers, said current switching means generating output signals corresponding to said CML signals.

7. A logic level translator as defined in claim 6 further including current source means which couples said first power terminal to said reference potential means.

8. A logic level translator as defined in claim 6 further including a third emitter follower which couples said TTL signals to said voltage dividing means.

9. A logic level translator as defined in claim 6 wherein said current switching means comprises a transistor pair with their collectors connected to said second power terminal and their emitters connected to said first power terminal, the base of one transistor of said transistor pair responsive to signals generated by said first emitter follower, the base of the other transistor of said transistor pair responsive to signals generated by said second emitter follower.

10. A logic level translator for translating TTL logic level signals with respect to ground of a first unit to ECL logic level signals with respect to ground of a second unit, said translator comprising:
reference potential means for providing reference potential signals;
voltage dividing means coupled to said first unit ground and said reference voltage means and responsive to said TTL signals;
a first emitter follower with its input terminal coupled to said first unit ground;
a second emitter follower with its input terminal responsive to signals from said voltage dividing means;
current switching means having first and second power terminals coupled to said reference potential means and to said second unit ground respectively, said current switching means responsive to the difference between signals generated by said first and said second emitter followers, said current switching means generating intermediate signals corresponding to said ECL signals, and
a third emitter follower coupled between said second unit ground and said reference potential means and responsive to said intermediate signals, said third emitter follower generating output signals corresponding to said ECL signals.

11. A logic level translator as defined in claim 10 further including current source means which couples said first power terminal to said reference potential means.

12. A logic level translator as defined in claim 10 further including a fourth emitter follower which couples said TTL signals to said voltage dividing means.

13. A logic level translator as defined in claim 10 wherein said current switching means comprises a transistor pair with their collectors connected to said second power terminal and their emitters connected to said first power terminal, the base of one transistor of said transistor pair responsive to signals generated by said first emitter follower, the base of the other transistor of said transistor pair responsive to signals generated by said second emitter follower.

* * * * *